(12) United States Patent
Bracchitta et al.

(10) Patent No.: US 6,255,699 B1
(45) Date of Patent: Jul. 3, 2001

(54) PILLAR CMOS STRUCTURE

(75) Inventors: John A. Bracchitta, South Burlington, VT (US); Jack A. Mandelman, Stormville, NY (US); Stephen A. Parke, Nampa, ID (US); Matthew R. Wordeman, Mahopac, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/561,676

(22) Filed: May 1, 2000

Related U.S. Application Data

(62) Division of application No. 09/009,456, filed on Jan. 20, 1998, now Pat. No. 6,100,123.

(51) Int. Cl.[7] .............................. H01L 29/76; H01L 23/62
(52) U.S. Cl. .............................. 257/369; 257/67; 257/69; 257/204; 257/206; 257/338; 257/350; 257/351; 257/357; 257/365; 257/366; 257/367; 257/368; 257/369; 257/370; 257/371; 257/511; 438/153; 438/154; 438/199; 438/209; 438/212; 438/213
(58) Field of Search .................................. 257/369, 338, 257/350, 351, 357, 365–371, 67, 69, 385, 204, 206, 511; 438/199, 209, 212, 213, 153, 154

(56) References Cited

U.S. PATENT DOCUMENTS

| | | |
|---|---|---|
| 4,566,025 | 1/1986 | Jastrzebski et al. . |
| 4,670,768 * | 6/1987 | Sunami et al. ..................... 357/42 |
| 4,686,758 | 8/1987 | Liu et al. . |
| 4,740,826 | 4/1988 | Chatterjee . |
| 5,010,386 | 4/1991 | Groover, III . |
| 5,032,529 | 7/1991 | Beitman et al. . |
| 5,072,276 | 12/1991 | Malhi et al. . |
| 5,225,701 * | 7/1993 | Shimizu et al. ..................... 257/347 |
| 5,258,635 * | 11/1993 | Nitayama et al. ..................... 257/329 |
| 5,294,823 * | 3/1994 | Eklund et al. ..................... 257/370 |
| 5,378,914 | 1/1995 | Ohzu et al. . |

OTHER PUBLICATIONS

IBM Technical Disclosure Bulletin, "Structures and Layout of a New Self–Aligned Pilar CMOS Logic Gate and SRAM Cell," vol. 32, No. 9A, Feb. 1990, pp. 338–340.*
IBM Technical Disclosure Bulletin, "New Self–Aligned Pillar CMOS Technology–Structures and Fabrication Methods," vol. 32, No. 8A, Jan. 1990, pp. 144–145.*

* cited by examiner

Primary Examiner—Tom Thomas
Assistant Examiner—Donghee Kang
(74) Attorney, Agent, or Firm—William N. Hogg

(57) ABSTRACT

A method of forming a pillar CMOS FET device, especially an inverter, and the device so formed is provided. The method includes forming abutting N wells and P wells in a silicon substrate and then forming $N^+$ and $P^+$ diffusions in the P and N wells respectively. A unitary pillar of the epitaxial silicon is grown on the substrate having a base at the substrate overlying both the N and P wells and preferably extending at least from said $N^+$ diffusion to said $P^+$ diffusion in said substrate. The pillar terminates at a distal end. An N well is formed on the side of the pillar overlying the N well in the substrate and a P well is formed on the side of the distal end of the pillar overlying the P well on the substrate and abuts the N well in the pillar. A $P^+$ diffusion is formed in the N well in the pillar adjacent the distal end and a $N^+$ diffusion is formed in the P well in the pillar adjacent the distal end. A gate insulator dioxide is formed over both sides of the pillar and gate electrodes are formed over the gate insulators.

4 Claims, 13 Drawing Sheets

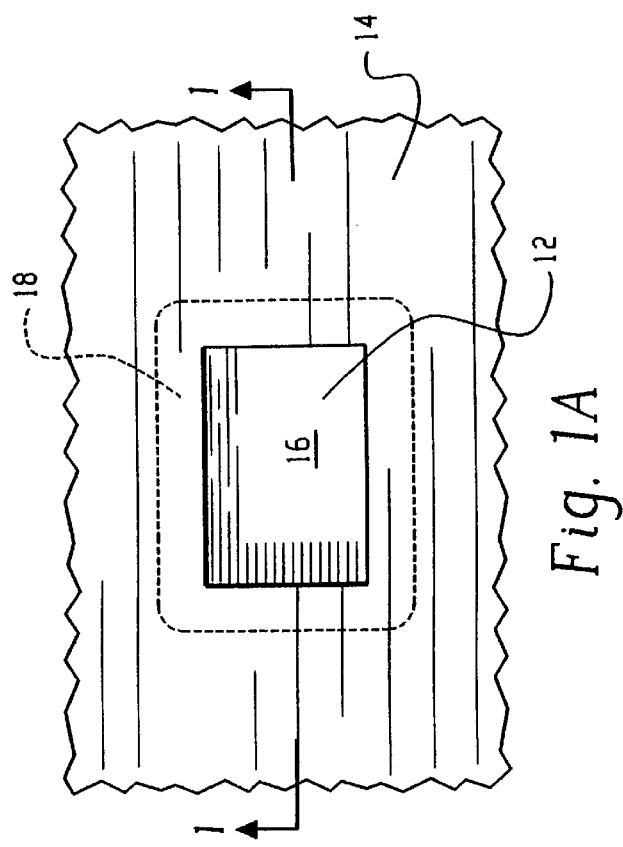
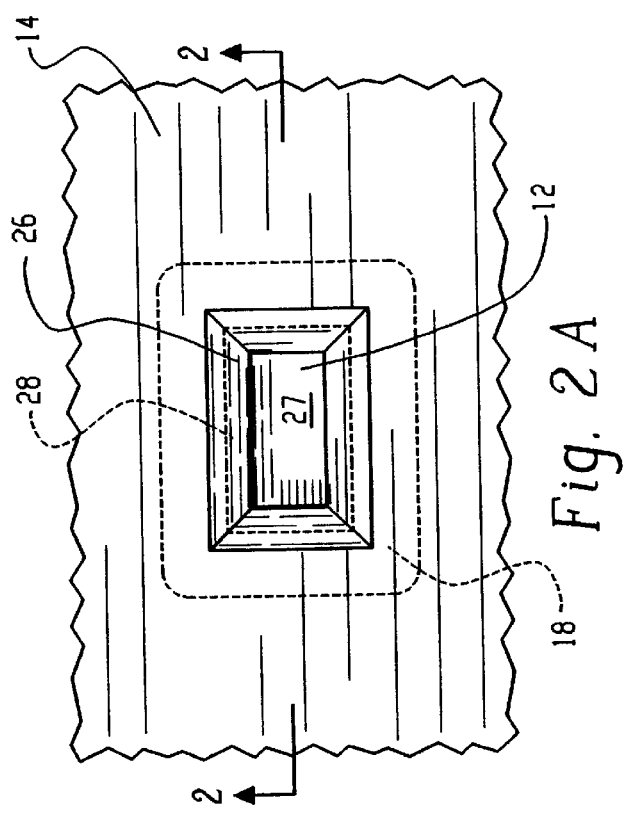
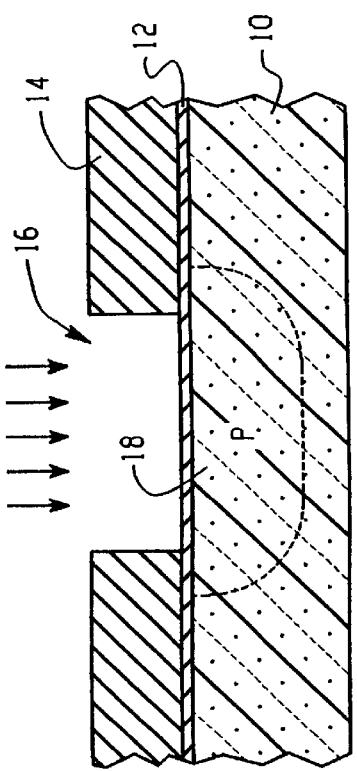
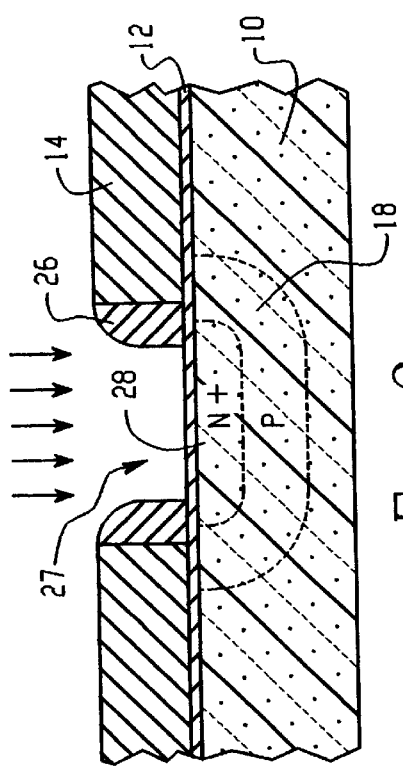

PILLAR CMOS STRUCTURE

RELATED APPLICATIONS

This application is a divisional of application Ser. No. 09/009,456, filed Jan. 20,1998, now U.S. Pat. No. 6,100,123.

BACKGROUND OF THE INVENTION

Field of the Invention

This invention relates generally to the formation of integrated structures and circuits on semi-conductor substrates and more particularly to the formation of FET structures and circuits. In even more particular aspects, this invention relates to formation of CMOS FET structures and circuits on semi-conductor substrates and especially to pillar CMOS technology which utilizes both vertical and horizontal surfaces on which to form FET devices.

BACKGROUND INFORMATION

One technique of increasing integrated circuit density on a given size semi-conductor substrate is by using vertical surfaces on which to form at least a portion of devices such as FET's. One form this takes is so-called pillar technology in which epitaxial silicon crystals or "pillars" are grown on a single silicon crystal substrate and the sidewalls of the grown epitaxial silicon "pillars", are used to form at least part of the devices, thus allowing increased integrated circuit density, i.e. more devices per horizontal surface of the substrate, without necessity of reducing the layout ground rule size. This permits the use of coarser lithography as well permitting greater channel length control, both of which are desirable results in integrated circuit technology.

The present invention provides an improved technique and resulting devices in pillar CMOS technology.

SUMMARY OF THE INVENTION

According to the present invention a method of forming a pillar CMOS FET device, especially an inverter, and the device so formed is provided. The method includes the steps of forming abutting N wells and P wells in a silicon substrate and then forming $N^+$ and $P^+$ diffusions in the P and N wells respectively. A unitary pillar of the epitaxial silicon is grown on the substrate which pillar has a base at the substrate which base overlays both the N and P wells and preferably extends at least from said $N^+$ diffusion to said $P^+$ diffusion in said substrate. The pillar terminates at a distal end. An N well is formed on the side of the pillar overlying the N well in the substrate and a P well is formed on the side of the distal end of the pillar overlying the P well on the substrate and abuts the N well in the pillar. A $P^+$ diffusion is formed in the N well in the pillar adjacent the distal end and a $N^+$ diffusion is formed in the P well in the pillar adjacent the distal end. A gate insulator preferably silicon dioxide is formed over both sides of the pillar and gate electrodes are formed over the gate insulators.

In one embodiment the mask material is formed on the substrate with an opening which extends down to the substrate and mandrel or spacer material is deposited in the opening around the walls of the mask. The epitaxial silicon is grown within the opening defining the spacer material. The spacer or mandrel material is then removed and gate insulators are grown on opposite sides of the pillar followed by forming gates on opposite sides of the pillar preferably of polysilicon. In this embodiment, wiring channels can be formed at the same time as the opening in the mask material is formed and the mandrel material deposited in the channels which mandrel material is removed at the same time the mandrel is removed after the growing of the epitaxial silicon. The insulator is grown on the substrate and wiring preferably polysilicon is deposited in the channels preferably at the same time that the gate material is deposited.

In another embodiment a self-aligning process of forming the pillar where the N and P wells is provided so as to precisely align the pillar on the substrate.

DESCRIPTION OF THE DRAWINGS

FIGS. 1 through 8 are longitudinal sectional views somewhat diagrammatic depicting the steps in forming a pillar CMOS structure according to one embodiment of the present invention:

FIGS. 1A through 5A are corresponding top-plan views somewhat diagrammatic of the structures shown in FIGS. 1 through 5 respectively;

DESCRIPTION OF THE PREFERRED EMBODIMENTS

Figure 3:
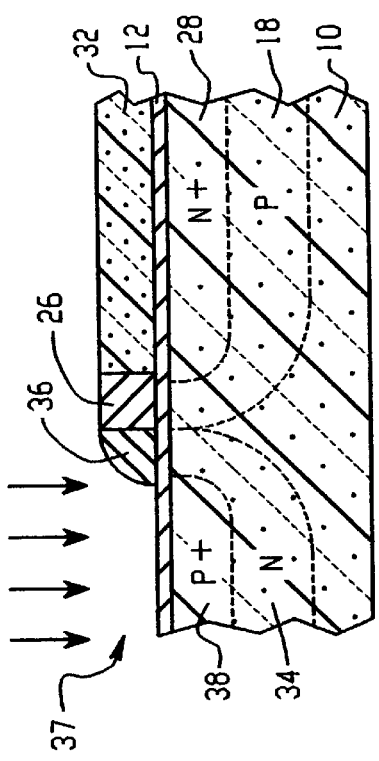

Referring now to the drawings and for the present FIGS. 1 through 8, 1A through 5A, and 7A and 8A, various successive steps in the production of a pillar CMOS structure according to one embodiment of the present invention is shown. As shown in FIGS. 1 and 1A, a single crystal silicon substrate 10 is provided which has formed thereon a layer of sacrificial silicon dioxide 12. Typically the silicon dioxide layer 12 is about 50 to 100 A thick. A mask material 14 which preferably is an insulating material and in the preferred embodiment is silicon nitride, is deposited on top of the oxide layer 12 which mask 14 has an opening 16 formed therein. The opening 16 can be formed by conventional photolithographic techniques wherein a photoresist material is applied over the mask, exposed, developed and the mask etched down to the oxide layer 12. The opening 16 is then used to implant P-type ions into the substrate 10 to form a P well 18. Typical P-type ions are boron, boron fluoride and indium with boron being the most common. This structure is shown in FIGS. 1 and 1A. (It is to be understood that many pillars are typically formed in the manufacture of the circuitry, with only one being shown for illustration.)

Following the implanting of the P ions to form the P well 18, sidewall oxide spacer 26 is formed around the opening 16 to thereby form a smaller opening 27 into which N-type ions are implanted to form an N+ diffusion zone 28. Typical N-type ions are phosphorous and arsenic. Thus as shown in FIGS. 2 and 2A a single silicon crystal substrate 10 is provided which has a P well 18 and N+ diffusion 28 therein.

Figure 3A:
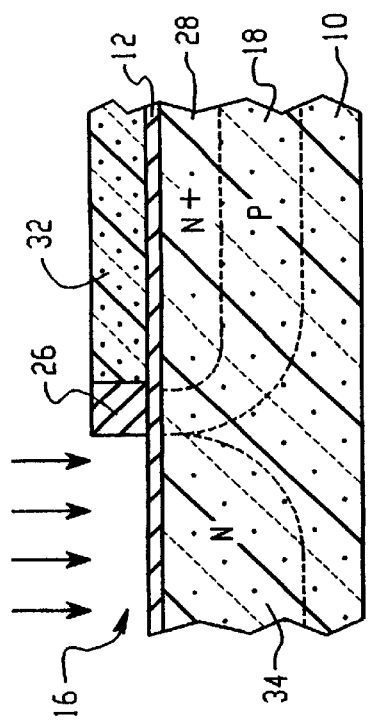

Following the steps shown in FIGS. 2 and 2A a layer of polysilicon 32 is deposited over the entire surface including the silicon nitride layer 14 and the exposed sacrificial oxide 12 on top of the N+ diffusion. The polysilicon layer 32 is then chemically/mechanically (CHEM/MEC) polished until the surface is planar and then by conventional photolithographic methods a portion of the nitride layer 14 is exposed and reactive ion etched down to the oxide layer 12 as shown in FIGS. 3 and 3a. Following this, N-type ions are implanted into the substrate 10 adjacent to the P well 18 to form an N well 34 as shown in FIG. 3

Figure 4:
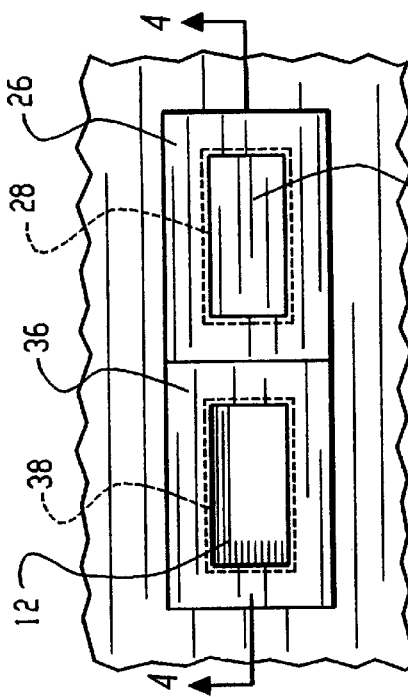

An additional sidewall oxide spacer 36 is then deposited as shown adjacent the oxide spacer 26 to form an opening 37 and P ions are implanted in the N well 34 to form a P+ diffusion 38 as shown in FIG. 4. Thus, at this point there are adjacent P and N wells with the P well having an N+ diffusion therein and the N well having a P diffusion therein.

Figure 4A:
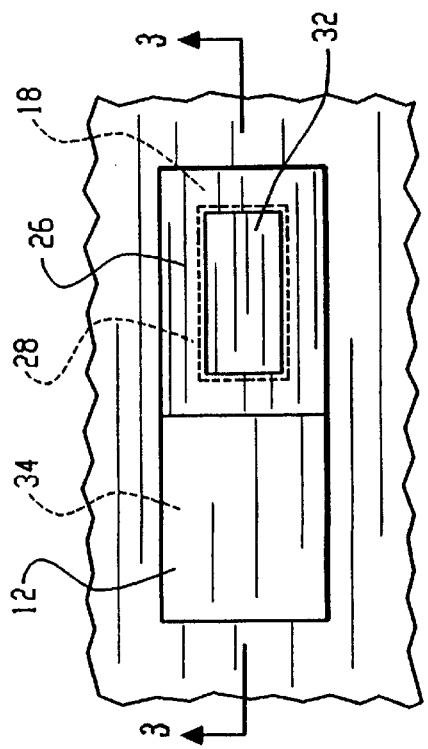
Figure 5:
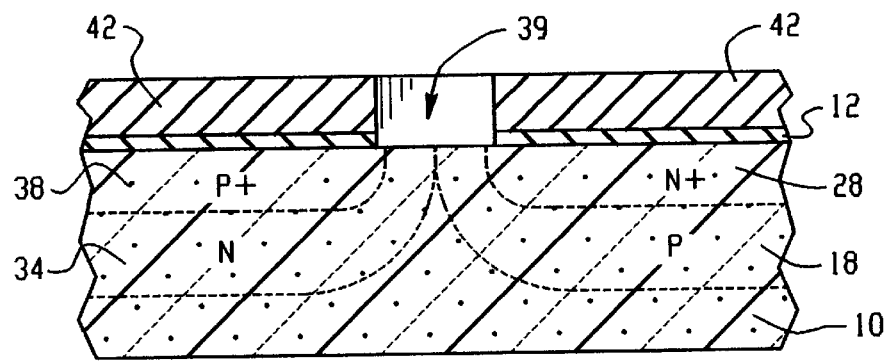
Figure 5A:
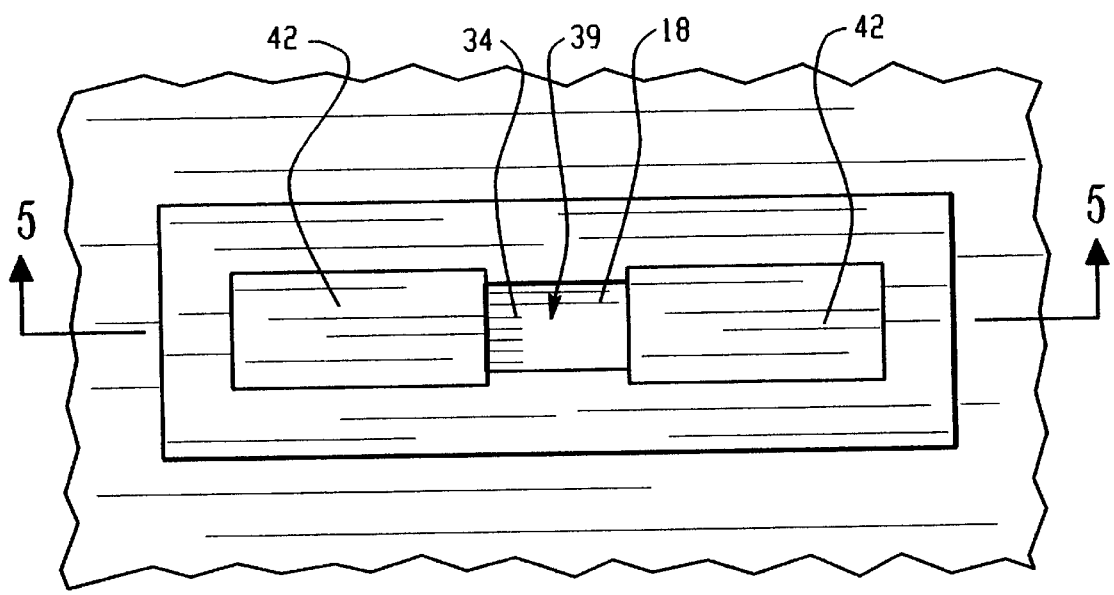

Following the formation of the P+ diffusion shown in FIGS. 4 and 4a, the remaining polysilicon 32 is stripped and silicon nitride 42 is deposited as a mask material around the oxide 26 and 36. This then planarized and the oxides 26 and 36 are then removed, in window 39, defined by a mark, as well as the oxide 12 underlying the oxide 26 and 36 etched down to the substrate as is shown in FIG. 5. This will expose portions of the P well and the N well since the etching of the oxides will remove the sacrificial oxide 12 in the opening as well as the oxides 26 and 36. This is shown in FIGS. 5 and 5A.

Figure 6:
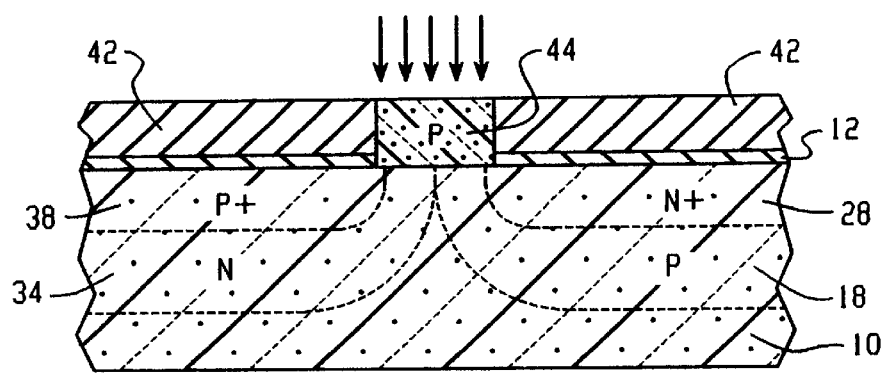

Following the removal of the oxides a column or pillar 44 of epitaxial silicon is grown in the opening on the exposed surface of the silicon substrate 10 where the oxides have been removed as shown in FIG. 6. The epitaxial silicon preferably is grown selectively at low temperatures, i.e. preferably below about 800° centigrade in an atmosphere such as di-chlor silane (DCS) plus $H_2$ plus HCl so as prevent nucleation on the sidewall sites and thus assure that single crystal epitaxial silicon will grow. However, technology advances have made it possible to use higher temperature and different ambients, in some instances. The structure is then polished by CHEM/MEC polishing and the epitaxial silicon is implanted with P-type ions to form a P well in the pillar 44 as shown in FIG. 6.

Figure 7:
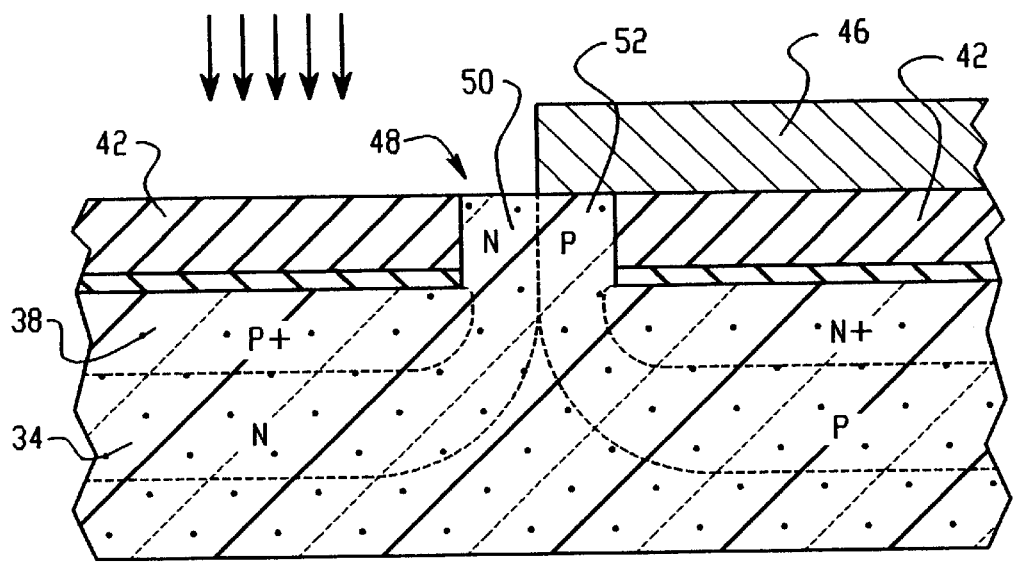
Figure 7A:
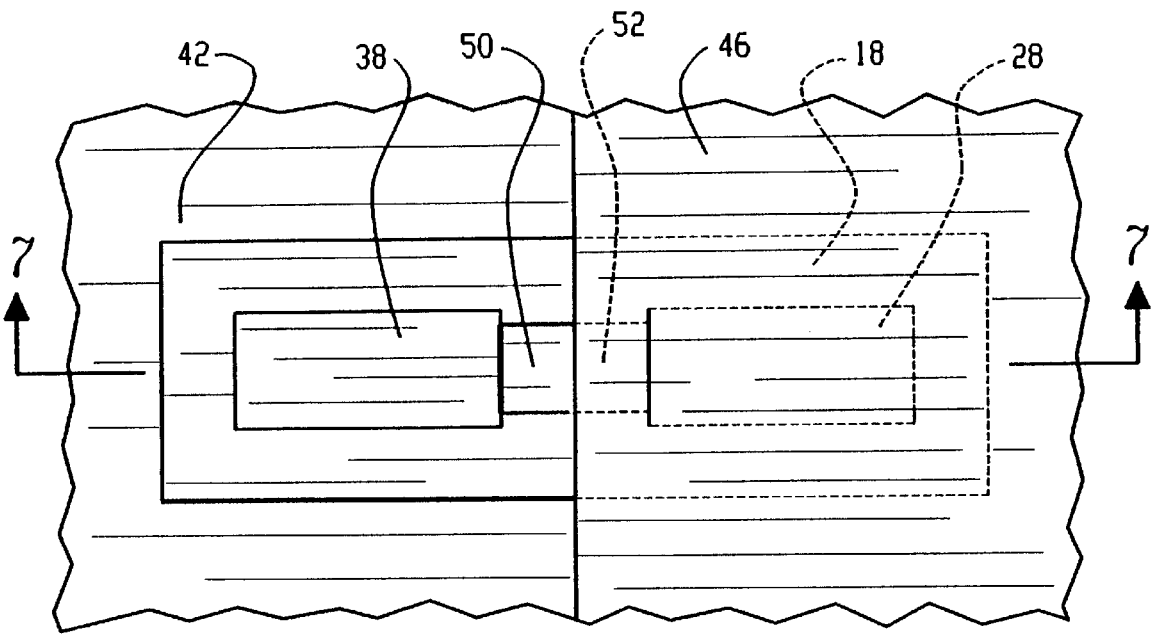
FIGS. 7A and 8A are corresponding top-plan views somewhat diagrammatic of the structures shown in FIGS. 7 and 8 respectively.

Following this, a layer of photoresist 46 is applied over the exposed surface of the silicon nitride 42 and the epitaxial silicon 44 shown in FIG. 6 and is patterned by conventional photolithographic techniques to form an opening 48 therein, which opening is generally aligned with the portion of the pillar 44 on top of the N well 34 and the portion of silicon nitride 42 overlying the P+ diffusion as shown in FIGS. 7 and 7a. This is then implanted with N-type ions to form a continuation of the N well as shown in FIGS. 7 and 7a. It will be appreciated that the implant of the N-type ions will counter dope the previous P doping and will thus form a pillar having an N well doped 50 on the left-hand side corresponding to and merging with the N well 34 and P well doped 52 on the right-hand side corresponding to and merging with the P-doped well 18, all as shown in FIGS. 7 and 7a.

Following of the forming of the structure shown in FIGS. 7 and 7a the photoresist 46 is stripped and an oxide cap 60 is grown on top of the pillar 44 and then the nitride mask 42 is stripped. Thereafter sidewall gate dielectrics such as silicon dioxide or silicon-oxynitride 62 and 63 are formed on opposite sides of the pillar 44. Thereafter a layer of polysilicon is deposited over the entire structure. The polysilicon layer is planarized and polished to the top of cap oxide 60 to form separate layers 64 and 66.

Figure 8:
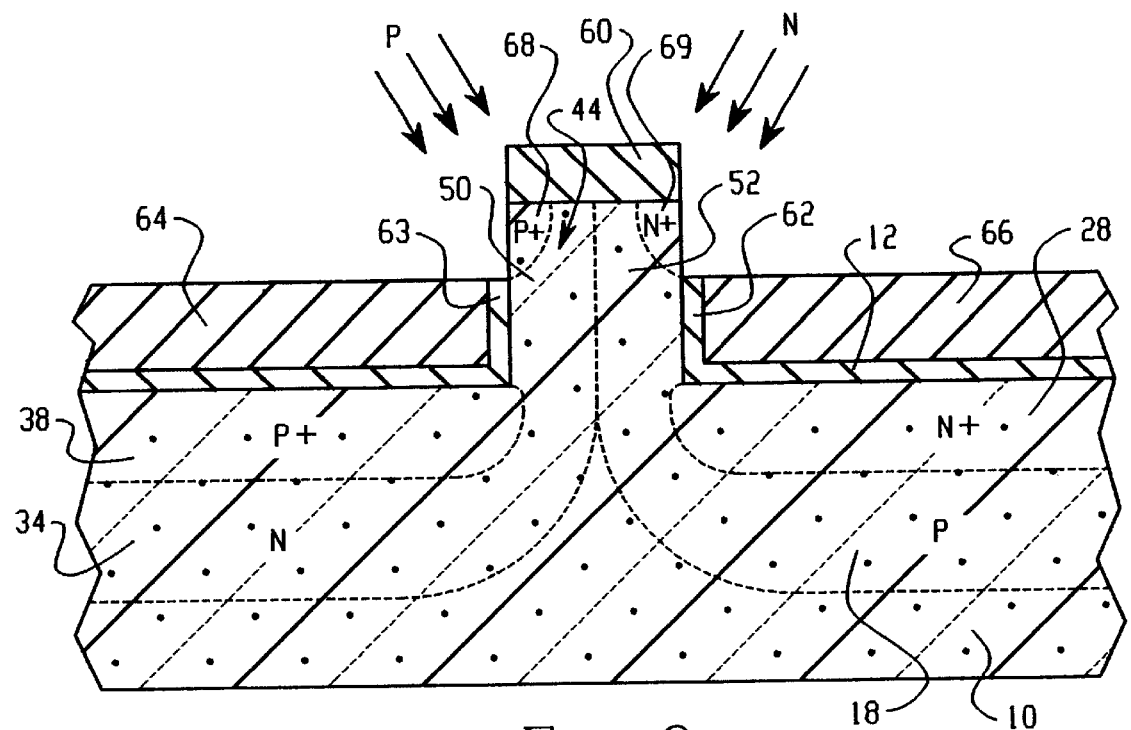
Figure 8A:
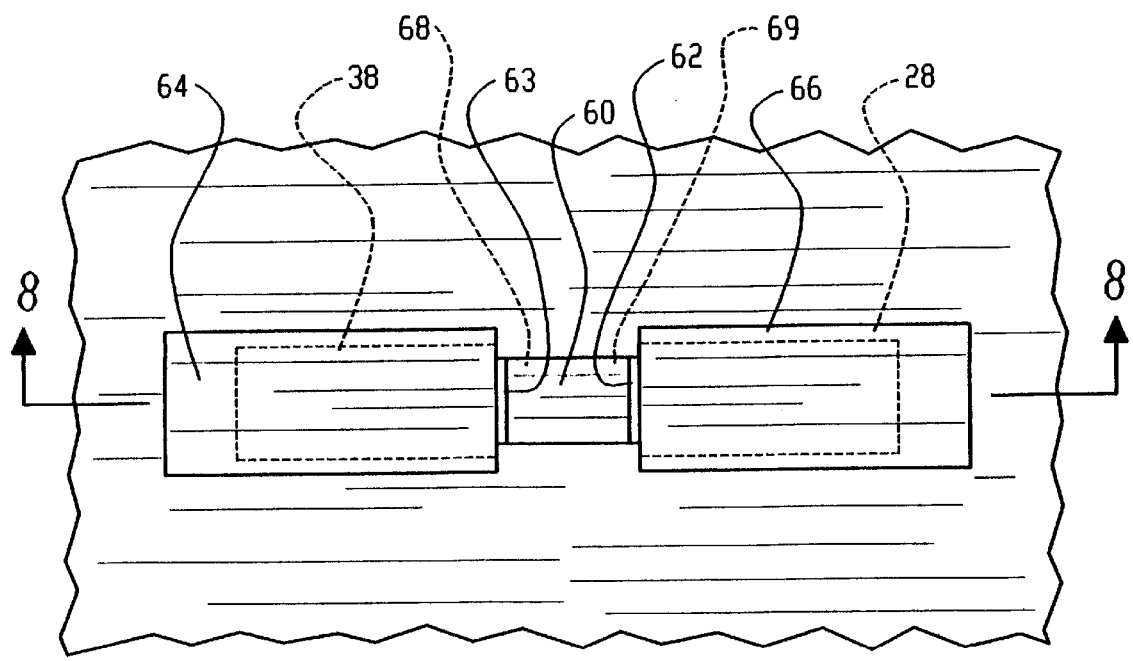

Polysilicon layers 64 and 66 are then reactive ion etched selective to oxide to the configuration shown in FIGS. 8 and 8a. Any remaining exposed thin gate oxide on the sides of the pillar 44 is removed. This will expose a portion of the top of the pillar 44 to angle implant P+ ions to form a P+ diffusion 68 in the N well on the left-hand side and to angle implant N-type ions to form an N+ diffusion 69 in the P well on the right-hand side of the pillar 44 (as shown in FIGS. 8 and 8a). A sacrificial oxide may be grown on the exposed silicon surfaces prior to the implanting of the diffusion is desired. As is well known in the art, photoresist is used to mask areas that are not to be implanted (i.e. right-hand side when left-hand side is implanted and vice-versa). Also the P+ ions will dope the polysilicon 64 and the N ions will dope the polysilicon 66.

The polysilicon 64 acts as a gate electrode over the gate oxide 63 for a PFET, the source and drain being the P+ diffusions, and the polysilicon 66 acts as a gate electrode over gate oxide 62 to form an NFET with the N+ diffusions acting as the source and drain for the NFET.

Thus as can be seen, the FET's are located on a pillar in a vertical direction and thus longer channels can be achieved if desired, without utilizing any additional space on the surface of silicon wafer 10; and more devices can be formed in a given area on the wafer 10.

Figure 9:
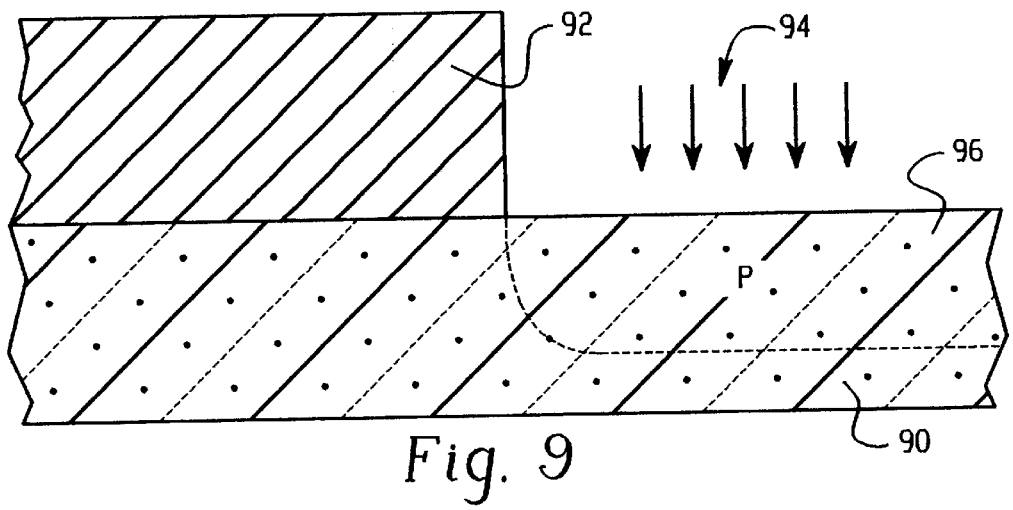
FIGS. 9 through 18 are longitudinal sectional views somewhat diagrammatic of the steps in forming a pillar CMOS structure according to another embodiment of the present invention.
Figure 10:
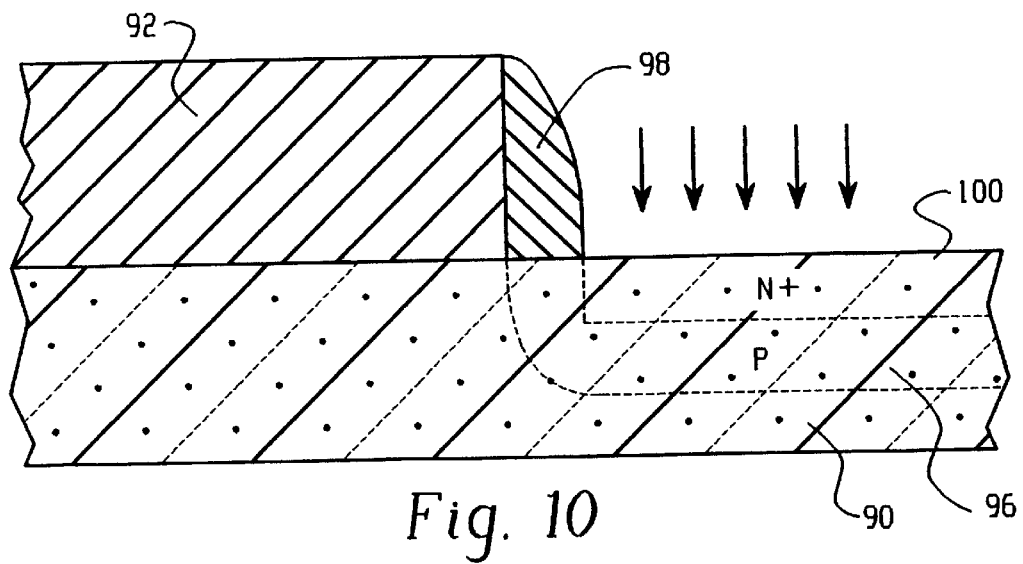

Referring now to FIGS. 9 through 17, the steps of forming a pillar CMOS structure according to another embodiment of the present invention are shown. As shown in FIG. 9 a single crystal silicon substrate 90 is provided on top of which is deposited a P well mask layer 92. The mask 92 can be a photoresist or other organic material, or silicon dioxide or silicon nitride. An opening 94 is formed in the mask material 92 and P-type ions are implanted to form a P well 96 in the substrate 90 as shown in FIG. 9. A sidewall spacer 98 is formed adjacent the P well 92 following which N+ diffusion zone 100 is formed in the P well by implanting N-type ions to form the structure as shown in FIG. 10. If mask layer 92 is photoresist or other organic material, spacer material 98 preferably should be organic such as photoresist, paralyne or polyimide.

Figure 11:
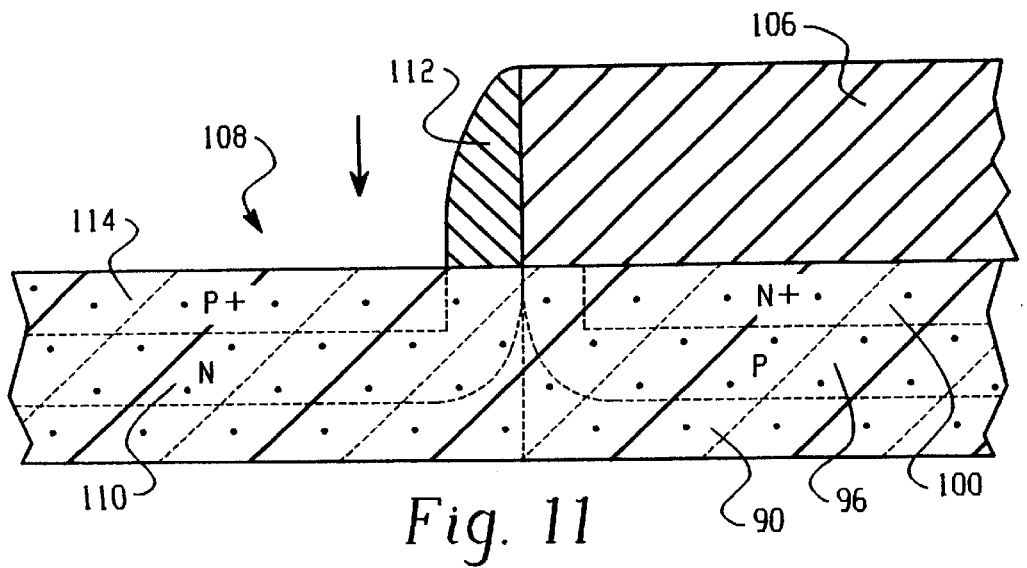

The mask 92 and the sidewall 98 are then stripped and an N well mask 106 is provided over the N+ diffusion in the P well with opening 108 overlying the substrate 90 adjacent the P well 96. Again, the mask is either a photoresist or other organic material or a silicon dioxide or silicon nitride material. N-type ions are implanted into the silicon substrate 90 adjacent the P well ions to form an N well 110. Side wall spacer 112 is then formed adjacent the N well mask 106 and P-type ions are implanted into the N well to form a P+ diffusion 114 as shown in FIG. 11. The N well mask material 106 and sidewall spacer 112 are then stripped and a pillar "hard" mask 120 is deposited on the stripped surface. The pillar mask preferably is silicon dioxide or silicon nitride to withstand subsequent hot processing steps, and an opening 122 is formed therein which overlies the portion of the P+ diffusion in the N well, and the N+ diffusion in the P well. This is formed by conventional photolithographic techniques wherein opened portion 122 of mask material 120 is etched down to the exposed substrate as shown in FIG. 12.

At the same time that the opening 122 is formed in the mask 120, openings or channels (one of which is shown) 124 for the channel wiring are also etched in the mask material 120 down to the substrate surface using the same photolithographic techniques and in the same operation as when the opening 122 is formed. This is shown somewhat diagrammatically in FIGS. 12 and 12A. (These channels could also be formed over an isolation region such as shallow trench insulation (STI), LOCOS (local oxidation of silicon) or other insulating material to reduce coupling to the substrate.)

Figure 12:
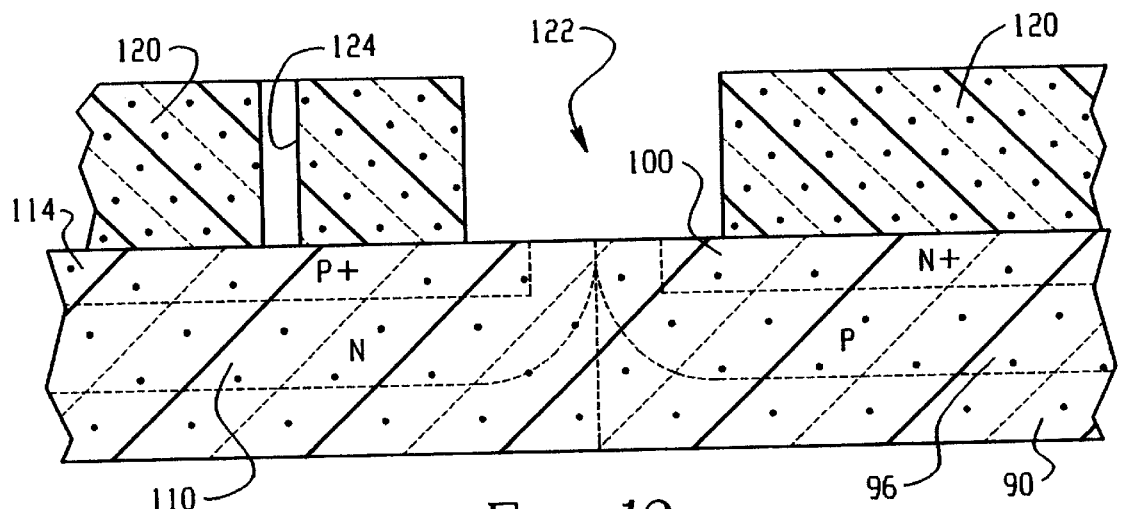
Figure 12A:
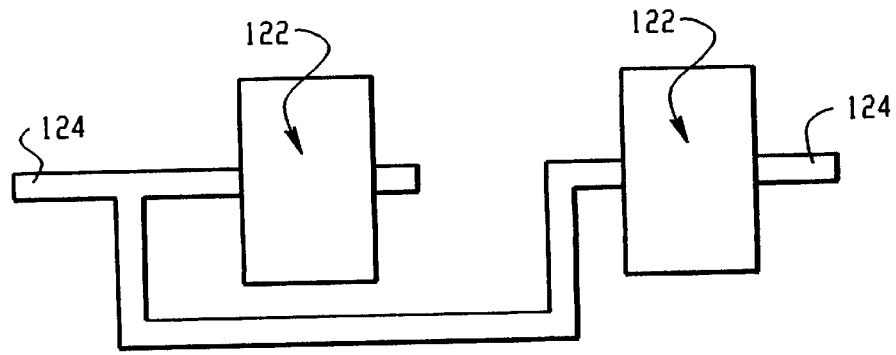
FIG. 12A is a top-plan view somewhat diagrammatic showing the etched wiring channels and openings for the polysilicon wiring and gates.
Figure 13:
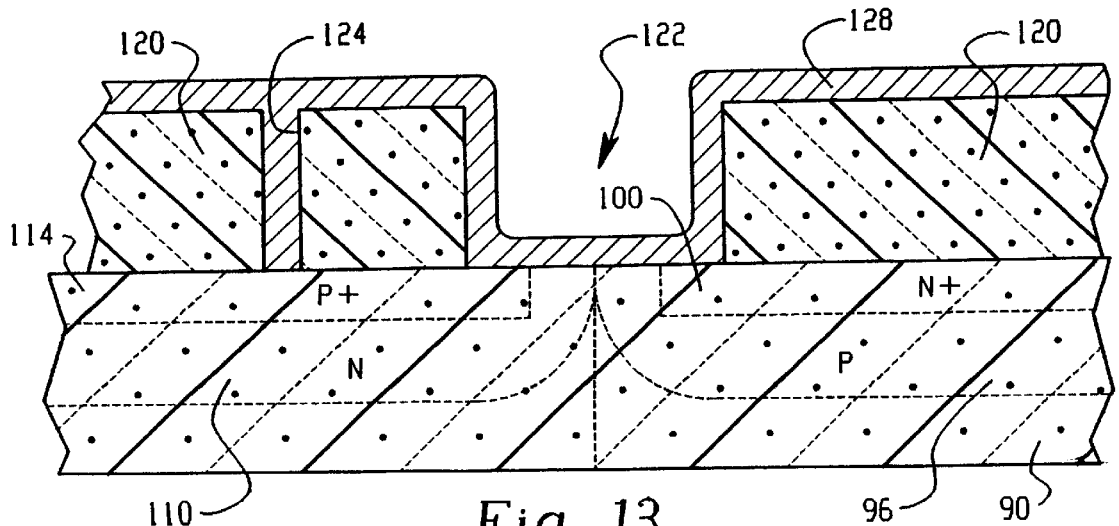
Figure 14:
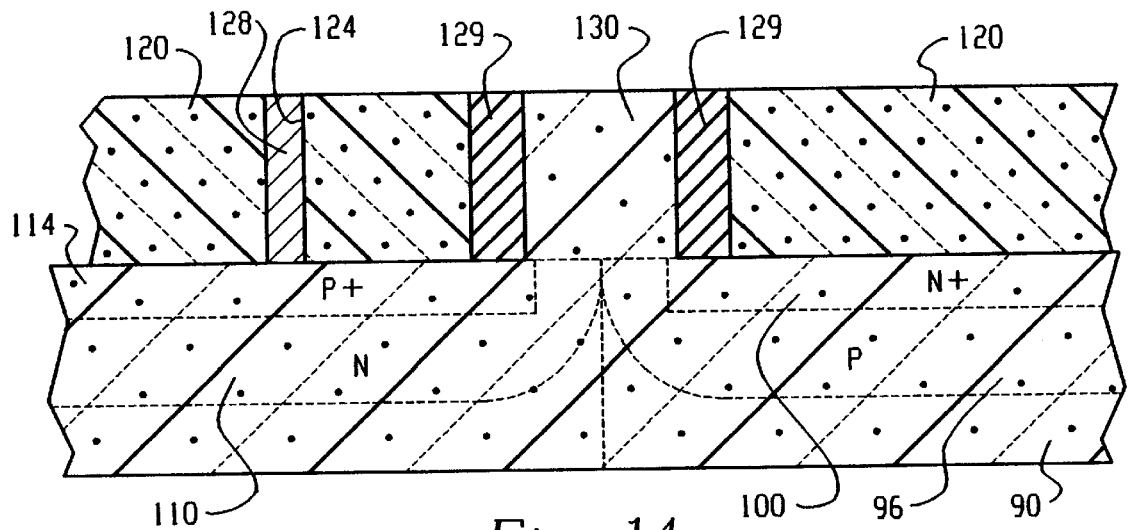

Following the forming of the opening 122 and the channels 124 for the wiring, a conformal layer of gate mandrel material 128 is deposited over the surface of the structure shown in FIG. 12, which completely fills the channel 124 and which conforms to the opening 122 as shown in FIG. 13. The material 128 is selected so as to etch selectively to both the mask material 120 and epitaxial silicon as will be explained presently. Thus if, for example, the mask 120 is formed of silicon dioxide which is preferable, the mandrel material 128 is a silicon nitride. Reactive Ion Etching (RIE) is used to form spacers 129 from the mandrel material 128 on the edges of the mask 120 in the opening 122. Thereafter a pillar or column 130 of epitaxial silicon is grown from the surface of the crystal 90. The top of the pillar 130 is preferably planarized by CHEM/MEC polishing. (Due to the much higher aspect ratio of the channels 124, the mandrel material 128 in the channels 124 blocks the bottom of the channel opening, thus preventing subsequent epitaxial silicon growth in the gate channel wiring opening 124.) The pillar 130 is separated from the mask 120 by the spacers 129, as is shown in FIG. 14.

Figure 15:
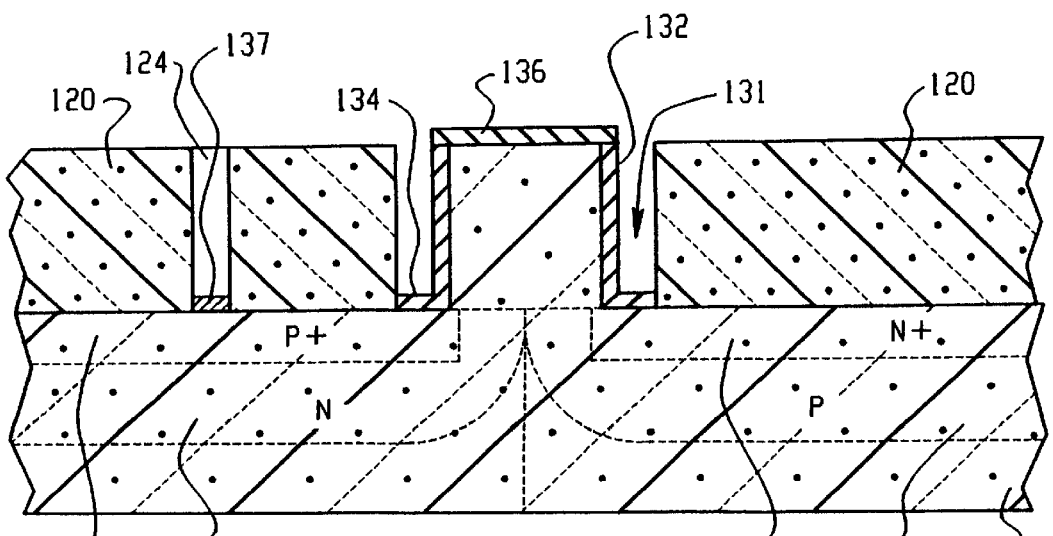
Figure 16:
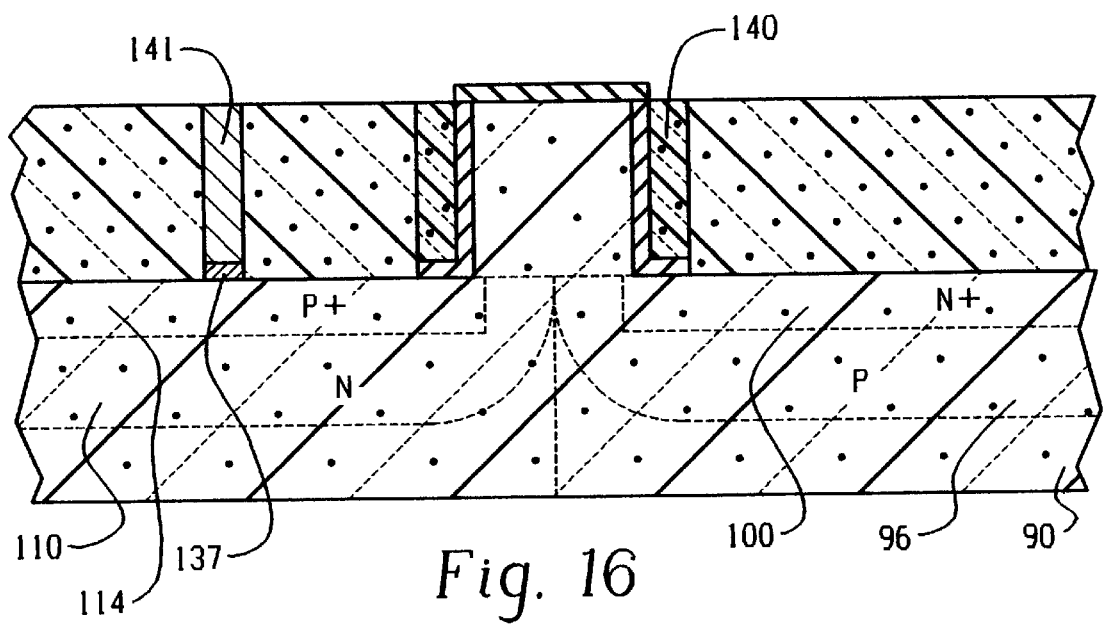

Following the growing of the column 130 the spacers 129 are removed by etching leaving a space 131 between the pillar 130 and the mask 120. This also removes remaining mandrel material 128 in the channels, and this opens the wiring channels 124 to the substrate. Thereafter gate dielectric 132 such as silicon dioxide is formed on the sides of the pillar 132, gate dielectric 134 is formed on the surface of the silicon crystal 90, and cap dielectric 136 is formed on top of the pillar 130 Also, dielectric material 137 is formed on the substrate 10 in the channels 134. This is shown in FIG. 15. Following this, gate polysilicon 140 is deposited in the space 131 between the gate dielectric 132 and the pillar mask 120 as shown in FIG. 16. Gate polysilicon 141 is also deposited in the gate wiring channels 124 on material 137 also as shown is FIG. 16.

Figure 16A:
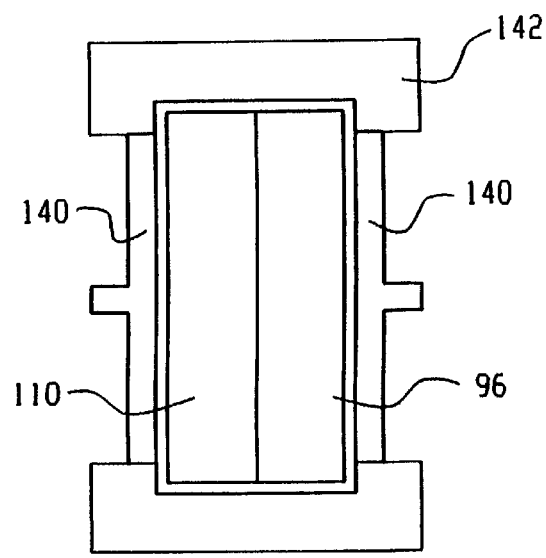
FIG. 16A is a top-plan x-ray view of a device of FIG. 16 with a cut mask shown for etching the polysilicon gates.

FIG. 16A depicts photolithographic techniques used to remove the ends of the polysilicon 140 so as to have separate gate electrodes on opposite sides of the pillar 132. This is done by photolithographic techniques using photoresist and a cut-mask 142 as shown diagrammatically in 16A and is known in the art. Removal of gate conductor from the sides of the pillar prevents parasitic conduction from source/drain diffusions to adjacent wells.

Figure 17:
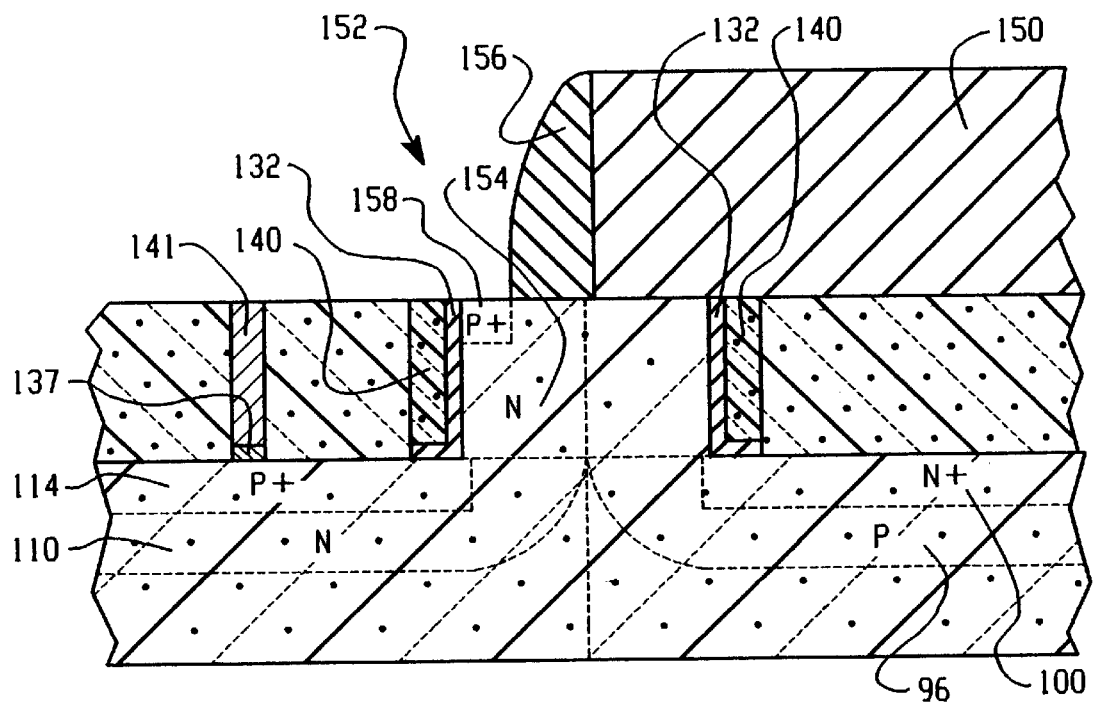
Figure 18:
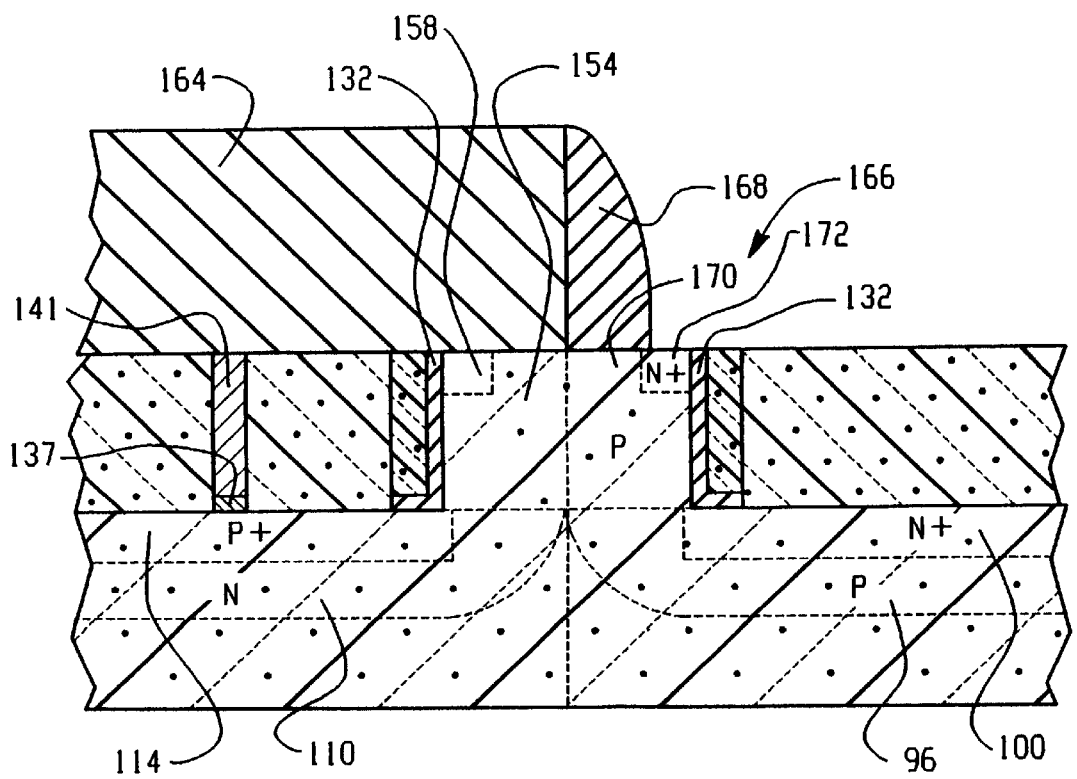

Following this, the cap oxide 136 is removed. The implanting of the pillar 130 to form wells and diffusions is shown, diagrammatically in FIGS. 17 and 18. As shown in FIG. 17 an N well mask 150 is provided having an opening 152 through which an N well 154 is formed in the left side of the pillar 130. A spacer 156 is formed and a P$^+$ diffusion 158 is provided in the N well 154. The mask 150 and spacer 156 is then stripped and the same procedure is repeated on the opposite side using mask 164 having opening 166 and side wall spacer 168 to form a P well 170 on the right-hand side of the column 130 with an N$^+$ diffusion 172 in this P well. The mask 164 and sidewall material 168 is removed and thus FET devices are provided on the column which include a PFET with P$^+$ region 14 on the substrate 10 and the P$^+$ region 158 in the pillar 130 acting as a source and drain and the polysilicon 140 as the gate and an NFET is provided on the opposite side of the pillar with the N$^+$ region 100 on the substrate 90 and the N$^+$ region 172 in the pillar 130 acting as source and drain and polysilicon 140 acting as a gate.

Figure 19:
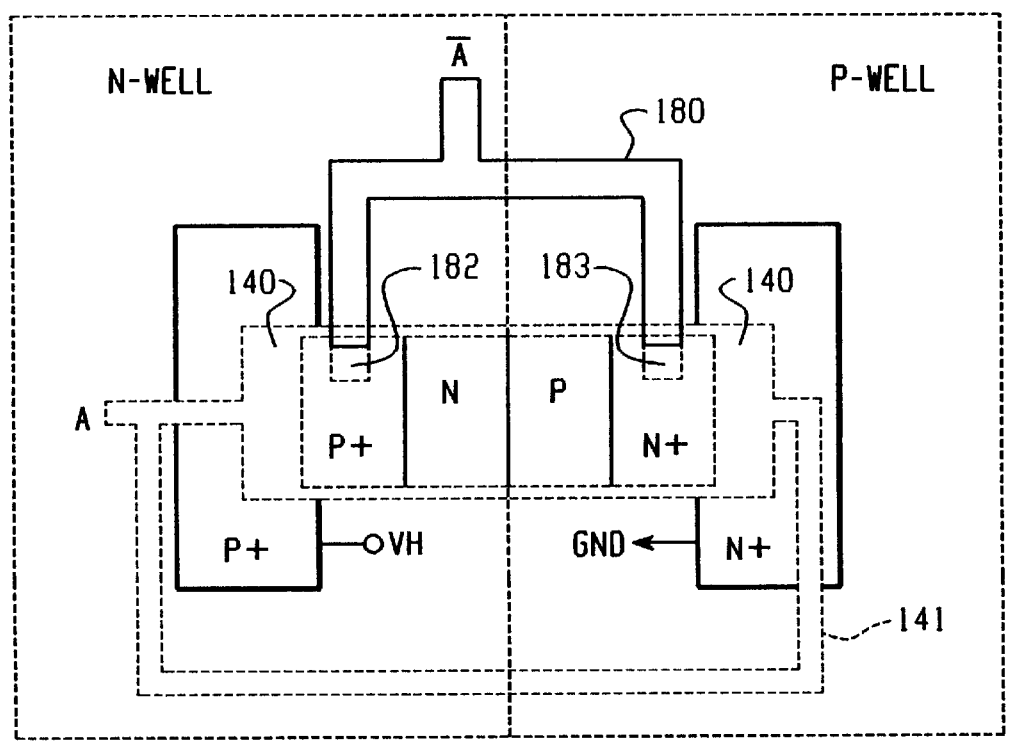
FIG. 19 is a top plan view somewhat schematic showing the wiring of two devices formed on a pillar as an inverter.
Figure 19A:
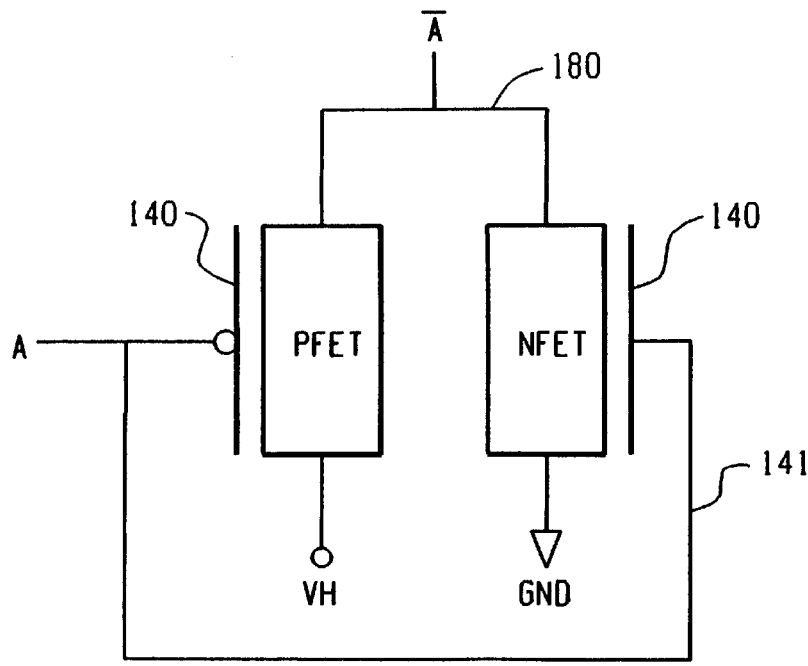
FIG. 19A is a schematic representation of the circuitry formed by the connection in FIG. 19.

FIG. 19 is a somewhat schematic top plan view representation of the wiring of the two devices formed on a single pillar in the substrate for use as an inverter. As can be seen the gate wiring 141 connects the gates 140 on both the PFET and the NFET. This constitutes one level of wiring. A second level of wiring designated as 180 connects the P$^+$ and N$^+$ diffusions at contacts 182 and 183 respectively of the opposite sides of the pillar and it is tied together to be the output $\overline{A}$ from the inverter. The input A is to the gate wiring 141 as indicated in FIG. 19. Voltage and ground are applied as shown schematically at VH and GND respectively. The circuit representation of the connection shown in FIG. 19 is shown in FIG. 19A.

Figure 20:
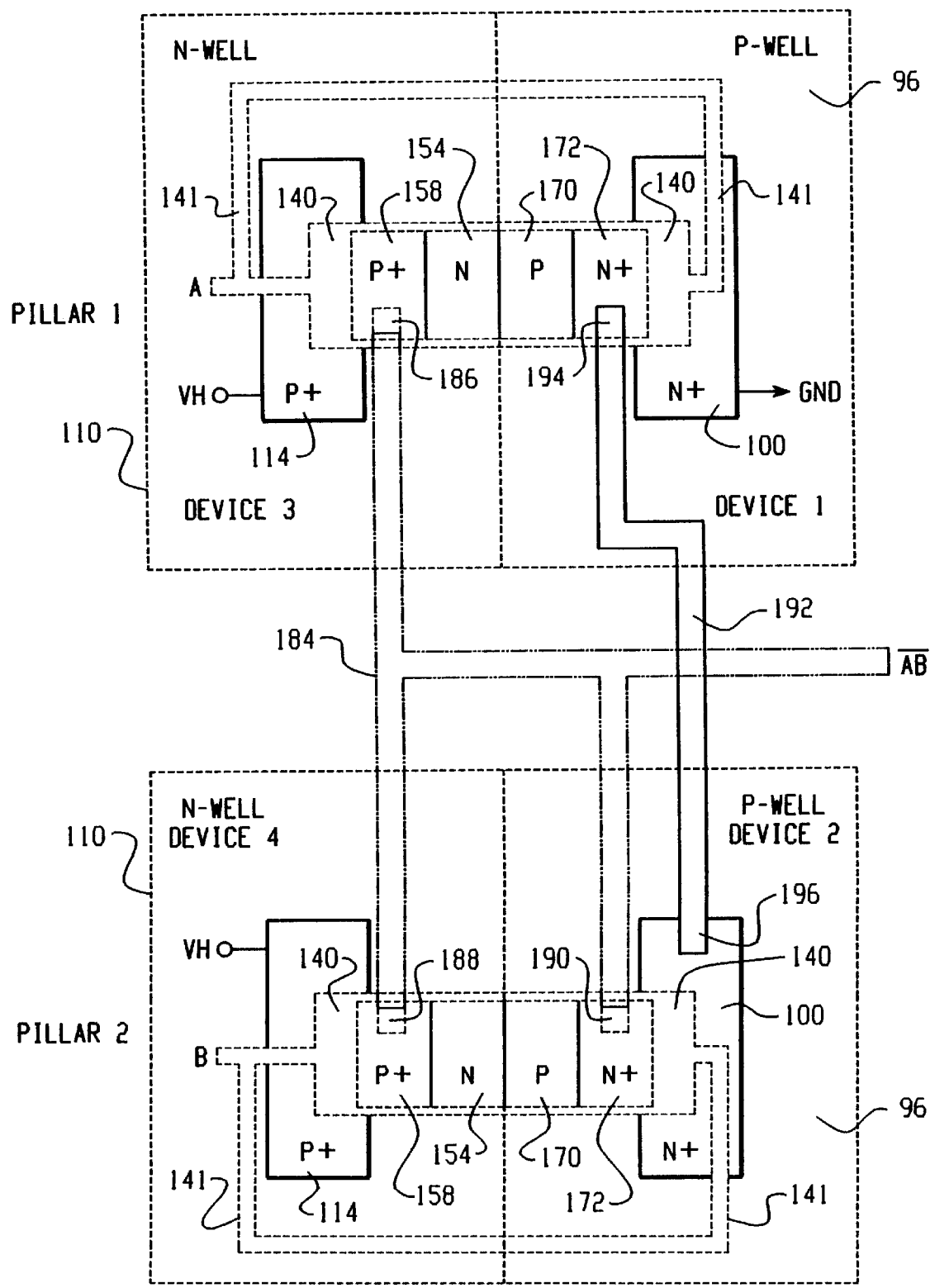
FIG. 20 is a top plan view somewhat schematic of two pillar constituting four devices where there is a two input NAND gate.
Figure 20A:
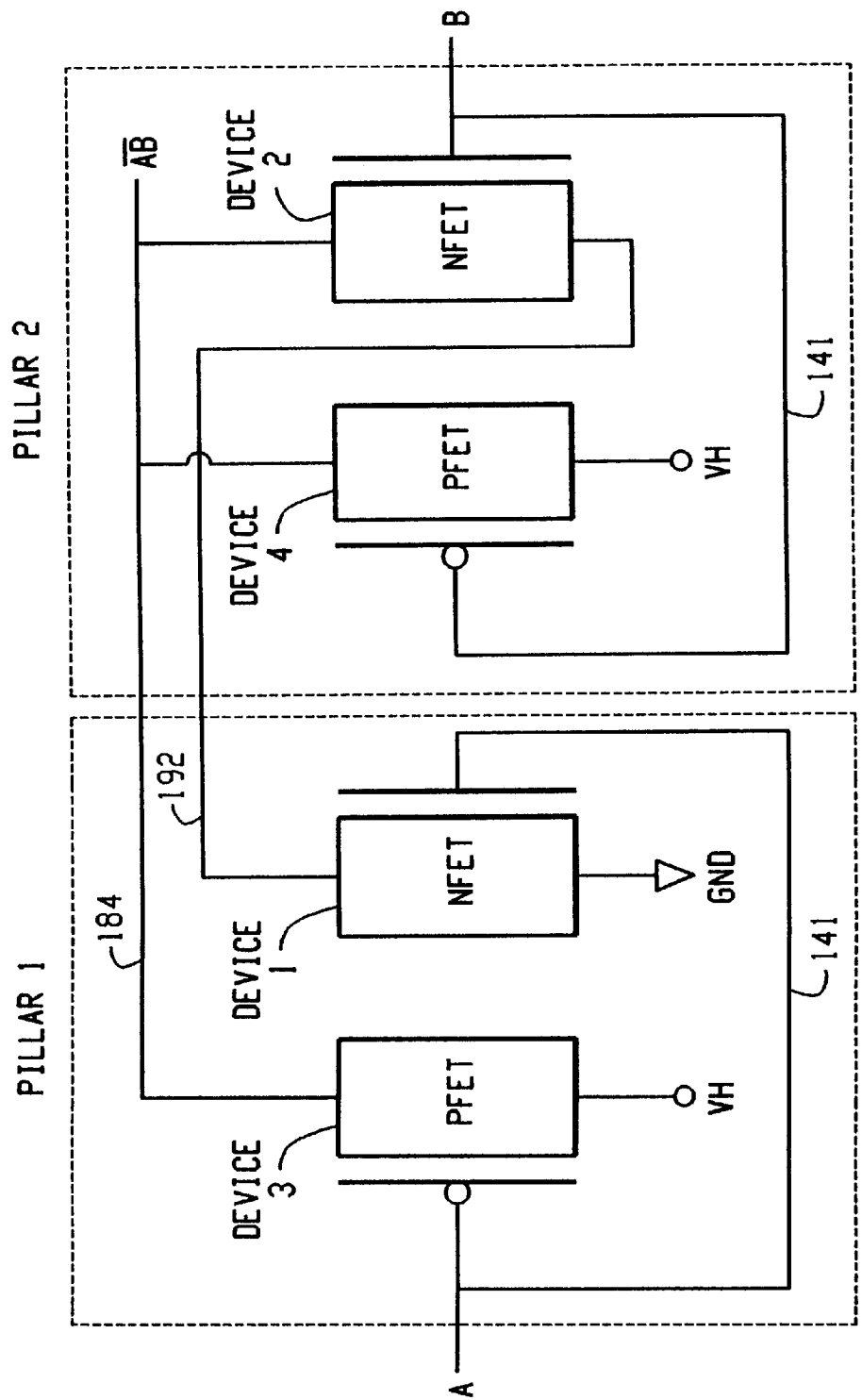
FIG. 20A is a schematic circuit representation of the circuit formed by the wiring in FIG. 20.

FIG. 20 is a top plan view somewhat schematic showing two pillars on the substrate constituting four devices wired as a NAND gate. The pillars are designated arbitrarily pillar 1 and pillar 2 and the devices are designated arbitrarily device 1, device 2, device 3, and device 4. (These designations correspond to the diagram shown in FIG. 20A.) As seen in FIG. 20, the gate wiring 141 ties gates 140 on opposite sides of both pillar 1 and pillar 2; i.e. the gates 140 of device 1 and device 3 are connected and the gates 140 of device 2 and device 4 are connected. The input to devices 1 and 3 is gate input A and the input to devices 2 and 4 is gate input B. At the next level up wiring 184 connects through contact 186 to P$^+$ diffusion 158 in device 3 and P$^+$ diffusion 158 through contact 188 in device 4 and to N$^+$ diffusion 172 in device 2 by contact 190. Typically line 184 constitutes the output AB. At the next level above the level of the wiring on 184, additional wiring 192 which is connected by via 194 to the N$^+$ diffusion 172 in device 1 and by via 196 to N$^+$ diffusion 100 in device 2. The P$^+$ diffusions 114 in the substrates in devices 3 and 4 are connected to voltage (VH) and the N$^+$ diffusions 100 in the substrate in devices 1 and 2 are connected to ground (GND). This connection is shown schematically in FIG. 20A. It is to be understood that the connections of the PFET and NFET as shown in FIGS. 19 and 19A to form an inverter are well known as well as are the connections of the PFET's and NFET's as shown in FIGS. 20 and 20A to form a NAND gate. It is also to be understood that other gates and the like can also be wired with the above two described being merely illustrative and not intended to be limiting.

what is claimed is:
1. A pillar CMOS FET circuit comprising:

A silicon substrate;
   a single undivided unitary pillar of epitaxial silicon extending from a base at said substrate to a distal end;
   said pillar having opposite sides with an N well on one side thereof and a P well on the other side thereof in contact with said N well;

an N⁺ diffusion in said P well at said distal end of said pillar and a P⁺ diffusion in the N well at said distal end of said pillar;

an N well in said substrate in contact with said N well in said pillar and a P well in said substrate in contact with said P well in said pillar;

a N⁺ diffusion in said P well in said substrate and a P⁺ diffusion in said N well in said substrate; and gate insulator and gate electrodes on said opposite sides of said pillar.

2. The invention is defined in claim 1 wherein said N⁺ diffusion in said P well in said substrate and said P⁺ diffusion in said N well each extend at least to the base of the epitaxial silicon pillar.

3. The invention is defined in claim 1 wherein a mask material of dielectric material is disposed on said substrate, and a plurality of wiring channels are formed in said mask material, and polysilicon is deposited in said wiring channels to connect said FET device as an inverter.

4. The invention as defined in claim 1 wherein said gate electrodes are polysilicon.

* * * * *